(12) United States Patent
Itoh et al.

(10) Patent No.: US 8,089,432 B2
(45) Date of Patent: Jan. 3, 2012

(54) DISPLAY DEVICE

(75) Inventors: Ryoki Itoh, Mie (JP); Yuhko Hisada, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 826 days.

(21) Appl. No.: 11/994,657

(22) PCT Filed: Apr. 26, 2006

(86) PCT No.: PCT/JP2006/308738
§ 371 (c)(1),
(2), (4) Date: Jan. 4, 2008

(87) PCT Pub. No.: WO2007/013210
PCT Pub. Date: Feb. 1, 2007

(65) Prior Publication Data
US 2009/0225015 A1    Sep. 10, 2009

(30) Foreign Application Priority Data
Jul. 29, 2005    (JP) ................................. 2005-222064

(51) Int. Cl.
*G09G 3/34*    (2006.01)
(52) U.S. Cl. .............................. 345/84; 345/76; 345/690
(58) Field of Classification Search ............ 345/76–100, 345/690
See application file for complete search history.

(56) References Cited

U.S. PATENT DOCUMENTS

| | | | |
|---|---|---|---|
| 6,888,604 B2 | 5/2005 | Rho et al. | |
| 6,989,876 B2 | 1/2006 | Song et al. | |
| 7,268,757 B2* | 9/2007 | Ben-David et al. | 345/88 |
| 2003/0085885 A1* | 5/2003 | Nakayoshi et al. | 345/205 |
| 2004/0046725 A1* | 3/2004 | Lee | 345/88 |
| 2004/0095521 A1* | 5/2004 | Song et al. | 349/61 |
| 2004/0223005 A1* | 11/2004 | Lee | 345/690 |
| 2005/0122294 A1* | 6/2005 | Ben-David et al. | 345/87 |
| 2005/0162600 A1 | 7/2005 | Rho et al. | |
| 2005/0270444 A1* | 12/2005 | Miller et al. | 349/108 |

(Continued)

FOREIGN PATENT DOCUMENTS

JP    2-118521 A    5/1990

(Continued)

OTHER PUBLICATIONS

Official communication issued in the International Application No. PCT/JP2006/308738, mailed on Jul. 11, 2006.

*Primary Examiner* — Alexander Eisen
*Assistant Examiner* — Viet Pham
(74) *Attorney, Agent, or Firm* — Keating & Bennett, LLP

(57) ABSTRACT

A display device that can prevent linear unevenness (uneven line) generated in one direction of a display image and can provide excellent display qualities includes a pixel including sub-pixels of n-colors (where n is an integer of 4 or more), and a signal line arranged to drive sub-pixels, the pixel and the signal line arranged to drive sub-pixels being disposed in a display region. The signal line arranged to drive sub-pixels is disposed on a display region center side of a sub-pixel positioned at least one terminal of the display region. The signal line arranged to drive sub-pixels is not disposed on a non-display region side of the sub-pixel positioned at the at least one terminal. The sub-pixel positioned at the at least one terminal has a color other than a color with the highest luminance of the n-colors.

20 Claims, 6 Drawing Sheets

U.S. PATENT DOCUMENTS

| | | |
|---|---|---|
| 2006/0007077 A1* | 1/2006 | Joo et al. .................... 345/77 |
| 2006/0098033 A1* | 5/2006 | Langendijk ................ 345/694 |
| 2007/0091043 A1 | 4/2007 | Rho et al. |

FOREIGN PATENT DOCUMENTS

| | | |
|---|---|---|
| JP | 4-355722 A | 12/1992 |
| JP | 5-181131 A | 7/1993 |
| JP | 6-93065 B2 | 11/1994 |
| JP | 7-333654 A | 12/1995 |
| JP | 10-10998 A | 1/1998 |
| JP | 10-307205 A | 11/1998 |
| JP | 11-295717 A | 10/1999 |

* cited by examiner

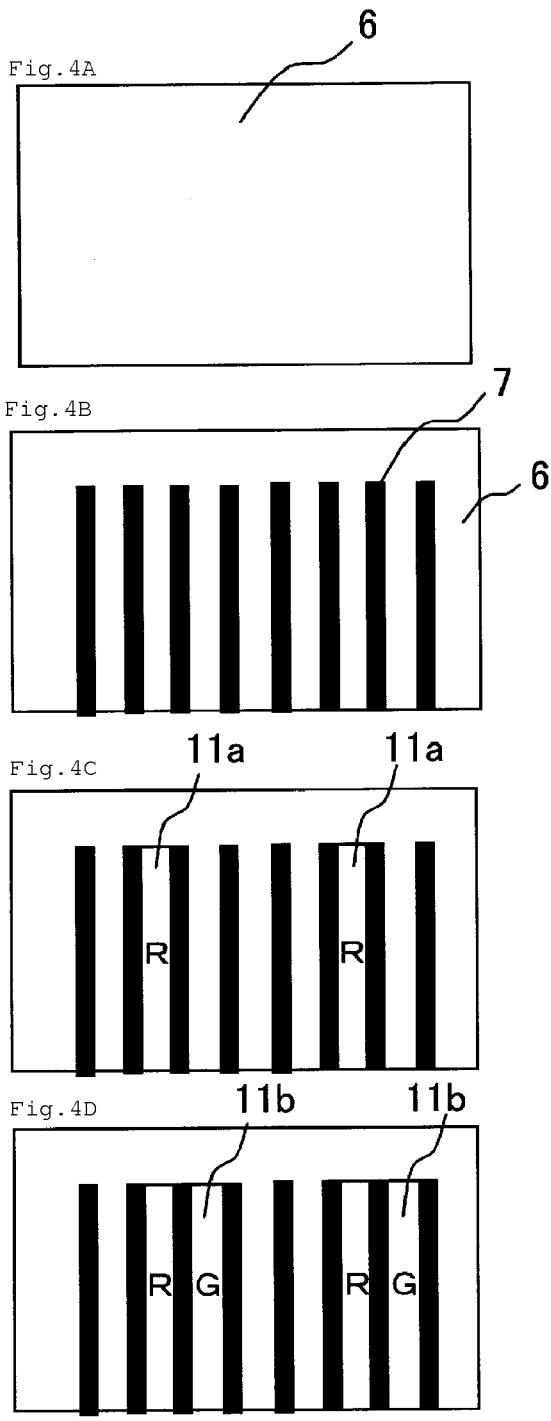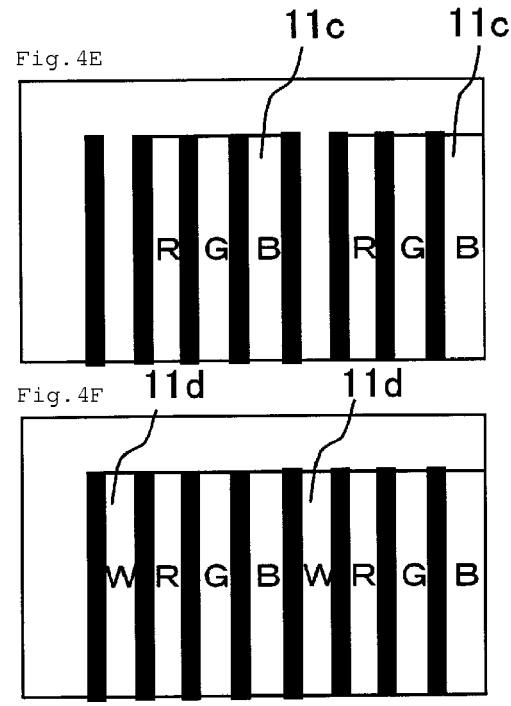

Fig.7A

| 1 | 3 | 4 | 2 | 5 |
| 1 | 4 | 3 | 2 | 5 |
| 1 | 3 | 2 | 4 | 5 |
| 1 | 4 | 2 | 3 | 5 |

Fig.7B

| 1 | 3 | 2 | 5 | 4 |
| 1 | 5 | 2 | 3 | 4 |
| 1 | 3 | 5 | 2 | 4 |
| 1 | 5 | 3 | 2 | 4 |

Fig.7C

| 1 | 4 | 2 | 5 | 3 |
| 1 | 5 | 2 | 4 | 3 |
| 1 | 4 | 5 | 2 | 3 |
| 1 | 5 | 4 | 2 | 3 |

| 2 | 3 | 1 | 4 | 5 |
| 2 | 4 | 1 | 3 | 5 |
| 2 | 3 | 4 | 1 | 5 |
| 2 | 4 | 3 | 1 | 5 |

| 2 | 3 | 1 | 5 | 4 |
| 2 | 5 | 1 | 3 | 4 |
| 2 | 3 | 5 | 1 | 4 |
| 2 | 5 | 3 | 1 | 4 |

| 2 | 4 | 1 | 5 | 3 |
| 2 | 5 | 1 | 4 | 3 |
| 2 | 4 | 5 | 1 | 3 |
| 2 | 5 | 4 | 1 | 3 |

| 3 | 1 | 4 | 2 | 5 |
| 3 | 2 | 4 | 1 | 5 |

| 4 | 1 | 3 | 2 | 5 |
| 4 | 2 | 3 | 1 | 5 |

Fig. 8A

| 1 | 3 | 4 | 5 | 2 | 6 |
| 1 | 4 | 3 | 5 | 2 | 6 |
| 1 | 3 | 5 | 4 | 2 | 6 |
| 1 | 5 | 3 | 4 | 2 | 6 |
| 1 | 4 | 5 | 3 | 2 | 6 |
| 1 | 5 | 4 | 3 | 2 | 6 |

| 1 | 4 | 2 | 5 | 3 | 6 |
| 1 | 5 | 2 | 4 | 3 | 6 |
| 1 | 4 | 5 | 2 | 3 | 6 |
| 1 | 5 | 4 | 2 | 3 | 6 |

| 1 | 3 | 2 | 5 | 4 | 6 |
| 1 | 5 | 2 | 3 | 4 | 6 |
| 1 | 3 | 5 | 2 | 4 | 6 |
| 1 | 5 | 3 | 2 | 4 | 6 |

| 1 | 3 | 2 | 4 | 5 | 6 |
| 1 | 4 | 2 | 3 | 5 | 6 |
| 1 | 3 | 4 | 2 | 5 | 6 |
| 1 | 4 | 3 | 2 | 5 | 6 |

Fig. 8B

| 1 | 3 | 4 | 6 | 2 | 5 |
| 1 | 4 | 3 | 6 | 2 | 5 |
| 1 | 3 | 6 | 4 | 2 | 5 |
| 1 | 6 | 3 | 4 | 2 | 5 |
| 1 | 4 | 6 | 3 | 2 | 5 |
| 1 | 6 | 4 | 3 | 2 | 5 |

| 1 | 4 | 2 | 6 | 3 | 5 |
| 1 | 6 | 2 | 4 | 3 | 5 |
| 1 | 4 | 6 | 2 | 3 | 5 |
| 1 | 6 | 4 | 2 | 3 | 5 |

| 1 | 3 | 2 | 6 | 4 | 5 |
| 1 | 6 | 2 | 3 | 4 | 5 |
| 1 | 3 | 6 | 2 | 4 | 5 |
| 1 | 6 | 3 | 2 | 4 | 5 |

| 1 | 3 | 2 | 4 | 6 | 5 |
| 1 | 4 | 2 | 3 | 6 | 5 |
| 1 | 3 | 4 | 2 | 6 | 5 |
| 1 | 4 | 3 | 2 | 6 | 5 |

Fig. 8C

| 1 | 3 | 5 | 6 | 2 | 4 |
| 1 | 5 | 3 | 6 | 2 | 4 |
| 1 | 3 | 6 | 5 | 2 | 4 |
| 1 | 6 | 3 | 5 | 2 | 4 |
| 1 | 5 | 6 | 3 | 2 | 4 |
| 1 | 6 | 5 | 3 | 2 | 4 |

| 1 | 5 | 2 | 6 | 3 | 4 |
| 1 | 6 | 2 | 5 | 3 | 4 |
| 1 | 5 | 6 | 2 | 3 | 4 |
| 1 | 6 | 5 | 2 | 3 | 4 |

| 1 | 3 | 2 | 6 | 5 | 4 |
| 1 | 6 | 2 | 3 | 5 | 4 |
| 1 | 3 | 6 | 2 | 5 | 4 |
| 1 | 6 | 3 | 2 | 5 | 4 |

| 1 | 3 | 2 | 5 | 6 | 4 |
| 1 | 5 | 2 | 3 | 6 | 4 |
| 1 | 3 | 5 | 2 | 6 | 4 |
| 1 | 5 | 3 | 2 | 6 | 4 |

Fig. 8D

| 1 | 4 | 5 | 6 | 2 | 3 |
| 1 | 5 | 4 | 6 | 2 | 3 |
| 1 | 4 | 6 | 5 | 2 | 3 |
| 1 | 6 | 4 | 5 | 2 | 3 |
| 1 | 5 | 6 | 4 | 2 | 3 |
| 1 | 6 | 5 | 4 | 2 | 3 |

| 1 | 5 | 2 | 6 | 4 | 3 |
| 1 | 6 | 2 | 5 | 4 | 3 |
| 1 | 5 | 6 | 2 | 4 | 3 |
| 1 | 6 | 5 | 2 | 4 | 3 |

| 1 | 4 | 2 | 6 | 5 | 3 |
| 1 | 6 | 2 | 4 | 5 | 3 |
| 1 | 4 | 6 | 2 | 5 | 3 |
| 1 | 6 | 4 | 2 | 5 | 3 |

| 1 | 4 | 2 | 5 | 6 | 3 |
| 1 | 5 | 2 | 4 | 6 | 3 |
| 1 | 4 | 5 | 2 | 6 | 3 |
| 1 | 5 | 4 | 2 | 6 | 3 |

DISPLAY DEVICE

BACKGROUND OF THE INVENTION

1. Field of the Invention

The present invention relates to display devices including a display screen constituted by a plurality of pixels. More specifically, the present invention relates to a display device including a display screen constituted by a plurality of pixels, such as a liquid crystal display device and an organic EL (Electroluminescent) display device.

2. Description of the Related Art

Display devices which display images using a plurality of pixels have been widely used for displaying information or images. A pixel including three sub-pixels of red (R), green (G), and blue (B) has been commonly used for displaying color images, as the pixel in such display devices. Active matrix driving has been widely used as a method of driving sub-pixels in thin displays such as a liquid crystal display device which have been rapidly increasingly in demand recently. According to the active matrix driving, a plurality of gate (scanning) lines and a plurality of source (signal) lines are disposed to be perpendicular to each other in a matrix pattern. At each intersection, an active element such as a thin film transistor (TFT) is disposed and a signal applied to the active element through the gate line and the source line drives each sub-pixel, and thereby images are displayed. A configuration of the sub-pixels constituting the pixels has a great influence on whether or not high-definition and high-quality color images can be displayed. Therefore, various configurations of the sub-pixels have been investigated.

A delta array in which RGB sub-pixels are displaced by one half sub-pixel for each row; a mosaic array in which RGB sub-pixels are displaced by one sub-pixel for each row; a square array in which RGBG sub-pixels are arranged to have a square shape, and a stripe array in which sub-pixels of the same color are vertically arrayed (in one direction) have been known as an array of sub-pixels of three colors. These sub-pixel arrays are used depending on products, and particularly for products such as a high-definition display for personal computers, the stripe array is generally used.

In addition, a display device including pixels each constituted by sub-pixels of four colors including white (W) with a high luminance for improvement in luminance of display images as well as R, B, and G has been known (for example, refer to Japanese Kokai Publication No. Hei-02-118521, Japanese Kokai Publication No. 2004-78218, Japanese Kokai Publication No. Hei-11-295717, Japanese Kokai Publication No. Hei-10-10998, Japanese Kokai Publication No. Hei-05-181131, and
Japanese Kokai Publication No. Hei-04-355722). According to such sub-pixel arrays, the luminance is improved and basic performances as a display device are improved.

In the stripe array, a sub-pixel array in which sub-pixels are arrayed in order of R, G, B, W has been known as an array of four sub-pixels of R, B, G, and W (for example, refer to Japanese Kokai Publication No. Hei-11-295717). However, if the sub-pixels are arrayed in this color order in accordance with the stripe array, linear unevenness, so-called, uneven line, is generated in one direction of an image. Accordingly, such a sub-pixel array has room for improvement in order to sufficiently suppress such display defects.

SUMMARY OF THE INVENTION

In order to overcome the problems described above, preferred embodiments of the present invention provide a display device in which linear unevenness (uneven line) generated in one direction of a display image can be prevented and thereby excellent display qualities can be obtained.

The present inventors have made various investigations of configurations that are capable of preventing an uneven line generated in display images in a display device including pixels including sub-pixels of n-colors (where n is an integer of 4 or more) and signal lines arranged to drive the sub-pixels. The inventors discovered that the uneven line in display images is generated in a sub-pixel which is positioned at a terminal (a terminal sub-pixel) where a signal line arranged to drive sub-pixels is disposed on the display region center side of the sub-pixel and no signal line arranged to drive sub-pixel is disposed on a non-display region side thereof. Further, the inventors discovered that the uneven line is remarkably recognized if the terminal sup-pixel is a white (W) sub-pixel with a high luminance. The inventors discovered that the uneven line generated at the terminal sub-pixel can be prevented and thereby excellent display qualities can be obtained if the terminal sub-pixel has a color other than a color with the highest luminance of n-colors. As a result, the above-mentioned problems have been solved, leading to completion of preferred embodiments of the present invention.

According to a preferred embodiment of the present invention, a display device includes: a pixel including sub-pixels of n-colors (where n is an integer of 4 or more); and a signal line arranged to drive sub-pixels, the pixel and the signal line arranged to drive sub-pixels being disposed in a display region, wherein the signal line arranged to drive sub-pixels is disposed on a display region center side of a sub-pixel positioned at least one terminal of the display region; the signal line arranged to drive sub-pixels is not disposed on a non-display region side of the sub-pixel positioned at the at least one terminal; and the sub-pixel positioned at the at least one terminal has a color other than a color with the highest luminance of the n-colors.

Display modes of the display device according to preferred embodiments of the present invention are not especially limited as long as the display device performs display using pixels each including sub-pixels of four or more colors. The display device according to various preferred embodiments of the present invention may be a non-self-luminous display device including color filters or a self-luminous display device having light sources of respective colors. Specifically, the display device according to preferred embodiments of the present invention is preferably used as a liquid crystal display device, an organic electroluminescent display device, and the like. Driving modes of the display device according to various preferred embodiments of the present invention is preferably active matrix driving in which an active element such as a TFT (Thin Film Transistor) is arranged in each sub-pixel to drive the sub-pixel, generally.

The above-mentioned sub-pixel is a display unit which can be individually driven and controlled, and generally, such a sub-pixel is a minimum unit which is controlled by a signal supplied through a signal line. In various preferred embodiments of the present invention, a group of sub-pixels of n-colors constitutes a pixel, and thereby color images are displayed. Colors of the sub-pixels of n-colors are not especially limited as long as color images are displayed. In various preferred embodiments of the present invention, for example, sub-pixels of four colors of red (R), blue (B), green (G), and white (W) are formed, and thereby the display device can display color images. The array of the sub-pixels is not especially limited, and examples thereof include a stripe array and a square array.

The above-mentioned display region is a region where pixels each including the sub-pixels of n-colors (n is an integer of 4 or more) are disposed and images are displayed. According to various preferred embodiments of the present invention, the above-mentioned display region does not include a region which is not used for display in the display device even if the pixels are disposed therein. Preferably, each of the pixels has a common sub-pixel array.

The above-mentioned non-display region is a region other than the above-mentioned display region, and generally is a region surrounding the display region.

The above-mentioned signal line arranged to drive sub-pixels is a signal line which is arranged to drive each sub-pixel (also referred to as a data line or a source line), and generally such a signal line is connected to an active element such as a TFT disposed in each sub-pixel. A signal line arranged to drive a sub-pixel which is disposed in the non-display region and not involved in display is disposed inside the display region in some cases, but such a signal line is not included in the above-mentioned signal line arranged to drive sub-pixels.

In various preferred embodiments of the present invention, the signal line arranged to drive sub-pixels is disposed on the display region center side of a sub-pixel positioned at least one terminal of the display region (a terminal sub-pixel) and the signal line arranged to drive sub-pixels is not disposed at the non-display region side thereof. The "positioned at least one terminal of the display region" means that the sub-pixel is positioned at least one of the both terminals in the lateral direction if a direction where the signal lines arranged to drive sub-pixels are disposed is defined as the vertical direction of the display region. The "display region center side" preferably is a region closer to the center of the display region than the center line drawn in the vertical direction of the sub-pixel (the center line connecting center points of sides in the lateral direction to each other) if the direction where the signal lines arranged to drive sub-pixels are disposed is defined as the vertical direction of the sub-pixel. The "non-display region side" preferably is a region closer to the non-display region than the center line drawn in the vertical direction of the sub-pixel if the direction where the signal lines arranged to drive sub-pixels are disposed is defined as the vertical direction of the sub-pixel. The above-mentioned signal line arranged to drive sub-pixels may or may not overlap with the sub-pixels, but more preferably it is positioned at the center between the sub-pixels. In various preferred embodiments of the present invention, the above-mentioned terminal sub-pixel may be positioned at both terminals of the display region or at one terminal thereof as long as it is positioned at least one terminal of the display region. However, the terminal sub-pixel is positioned at one terminal of the display region if the signal lines arranged to drive sub-pixels are formed at substantially the same positions with respect to the sub-pixels, respectively, for example, in order to simplify production steps.

Only on the display region center side of the above-mentioned terminal sub-pixel, the signal line arranged to drive sub-pixels used to drive the terminal sub-pixel itself is disposed, unlike other sub-pixels. Further, the terminal sub-pixel is not configured to be positioned between the signal line arranged to drive the terminal sub-pixel itself and the signal line arranged to drive an adjacent sub-pixel, unlike other sub-pixels. In various preferred embodiments of the present invention, sub-pixels other than the terminal sub-pixel are configured to be positioned between the signal lines arranged to drive sub-pixels.

The sub-pixels positioned between the signal lines arranged to drive sub-pixels, other than the terminal sub-pixel, are driven by inversion driving in which signal voltages having inverse polarities are applied to mutually adjacent signal lines arranged to drive sub-pixels. Therefore, change in electric potential of the sub-pixel, caused by a parasitic capacitance generated between a signal line arranged to drive sub-pixels disposed on one side of the sub-pixel and a sub-pixel electrode (so-called display electrode) can be eliminated by change in electric potential caused by a parasitic capacitance generated between a signal line arranged to drive sub-pixels disposed on the other side and the sub-pixel electrode.

In contrast, in a configuration in which the signal line arranged to drive sub-pixels is disposed only on one side, a parasitic capacitance generated between the signal line arranged to drive sub-pixels and the sub-pixel electrode influences an electric potential applied to the sub-pixel electrode, and thereby the electric potential is shifted from a specific potential. The above-mentioned terminal sub-pixel has a configuration in which the signal line arranged to drive sub-pixels is disposed only on one side of the terminal sub-pixel, and therefore the change in electric potential caused by the parasitic capacitance can not be eliminated. As a result, the uneven line is generated in images displayed by a pixel including the terminal sub-pixel, which may result in display defects. Also in a case where signal voltages with the same polarity are applied to mutually adjacent signal lines arranged to drive sub-pixels, not in the inversion driving, the change in electric potential caused by the parasitic capacitance is different between the terminal sub-pixel and sub-pixels other than the terminal sub-pixel, which causes the uneven line.

For this problem, according to various preferred embodiments of the present invention, a color other than a color with the highest luminance of the n-colors is disposed as the above-mentioned terminal sub-pixel. According to this, display defects are hardly observed visually even if the terminal sub-pixel has a parasitic capacitance which can not be eliminated, caused by the asymmetry arrangement of the signal lines arranged to drive sub-pixels and thereby an electric potential is changed. As a result, the linear unevenness (uneven line) can be prevented from being generated in the pixel including the terminal sub-pixel, and thereby excellent display qualities can be obtained.

The display device of preferred embodiments of the present invention may or may not include other components as long as it essentially includes such components. The configuration of the display device is not especially limited.

Preferred embodiments of the display device of the present invention are described below in more detail.

It is preferable that the sub-pixel positioned at the at least one terminal (the terminal sub-pixel) has a color with the lowest luminance of the n-colors. According to this, the terminal sub-pixel is a sub-pixel, of which display defects in display images are the least likely to be observed among the sub-pixels of the n-colors. Therefore, the uneven line in display images can be effectively prevented from being generated in a line where the terminal sub-pixel is disposed, even if the terminal sub-pixel is not positioned between the two signal lines arranged to drive sub-pixels and thereby the terminal sub-pixel has an electric potential different from that in other sub-pixels in the display region.

It is preferable that the pixel has a sub-pixel array in which a sub-pixel having a color with the lowest luminance of the n-colors is disposed at one end and a sub-pixel having a color with the highest luminance of the n-colors is disposed at the other end. According to this configuration, the sub-pixel having a color with the lowest luminance of the n-colors is adjacent to the sub-pixel having a color with the highest luminance in the entire display region where the pixels are arranged. Therefore, on the whole of the display region, the uneven line generated in display images can be prevented.

It is preferable that the pixel has a sub-pixel array in which a sub-pixel having a color with the highest luminance of the n-colors is not adjacent to a sub-pixel having a color with the second-highest luminance of the n-colors. If sub-pixels with higher luminances are adjacent to each other, the uneven line tends to be generated in display images in the line where the two adjacent sub-pixels are arrayed. However, according to this configuration, such uneven line generated in display images can be prevented.

It is preferable that the pixel includes sub-pixels of four colors, and the sub-pixels are arrayed in order of the highest-luminance color, the third-highest-luminance color, the second-highest-luminance color, the lowest-luminance color. According to this configuration in which the sub-pixels having colors with higher luminances of four colors are not adjacent to each other, the uneven line generated in display images can be prevented and excellent display qualities can be obtained.

It is preferable that the pixel includes sub-pixels of four colors and the sub-pixels are arrayed in order of white, red, green, blue. These four colors are white, green, red, and blue in descending order of luminance. According to this configuration in which white and green sub-pixels that are sub-pixels with higher luminances are not adjacent to each other, not only the uneven line generated in display images, attributed to the terminal sub-pixel, but also that attributed to the adjacent arrangement of the sub-pixels having colors with higher luminances can be prevented. As a result, excellent display qualities can be obtained.

It is preferable that the pixel includes sub-pixels of five colors, and the sub-pixels are arrayed in order of the highest-luminance color, the fourth-highest-luminance color, the third-highest-luminance color, the second-highest-luminance color, the lowest-luminance color, or in order of the highest-luminance color, the third-highest-luminance color, the fourth-highest-luminance color, the second-highest-luminance color, the lowest-luminance color. According to this configuration in which sub-pixels having colors with the highest luminance and the second highest luminance of five colors are not adjacent to each other, not only the uneven line generated in display images, attributed to the terminal sub-pixel, but also that attributed to the adjacent arrangement of the sub-pixels having colors with higher luminances can be prevented. As a result, excellent display qualities can be obtained.

It is preferable that the pixel includes sub-pixels of six colors, and the sub-pixels are arrayed in order of the highest-luminance color, the fifth-highest-luminance color, the third-highest-luminance color, the fourth-highest-luminance color, the second-highest-luminance color, the lowest-luminance color, in order of the highest-luminance color, the fourth-highest-luminance color, the fifth-highest-luminance color, the second-highest-luminance color, the third-highest-luminance color, the lowest-luminance color, in order of the highest-luminance color, the fourth-highest-luminance color, the second-highest-luminance color, the fifth-highest-luminance color, the third-highest luminance color, the lowest-luminance color, or in order of the highest-luminance color, the third-highest-luminance color, the fifth-highest-luminance color, the second-highest-luminance color, the fourth-highest-luminance color, the lowest-luminance color. According to this configuration in which sub-pixels having colors with the highest luminance and the second highest luminance of six colors are not adjacent to each other, not only the uneven line generated in display images, attributed to the terminal sub-pixel, but also that attributed to the adjacent arrangement of the sub-pixels having colors with higher luminances can be prevented. As a result, excellent display qualities can be obtained. Particularly according to a configuration in which the sub-pixels are arrayed in order of the highest-luminance color, the fifth highest-luminance color, the third-highest-luminance color, the fourth-highest-luminance color, the second-highest-luminance color, the lowest-luminance color, in order of the highest-luminance color, the fourth-highest-luminance color, the second-highest-luminance color, the fifth-highest-luminance color, the third-highest-luminance color, the lowest-luminance color, or in order of the highest-luminance color, the third-highest-luminance color, the fifth-highest-luminance color, the second-highest-luminance color, the fourth-highest-luminance color, the lowest luminance color, also the sub-pixels having colors with the second-highest and third-highest luminances are not adjacent to each other. Therefore, more excellent display qualities can be obtained. If the highest and the second-highest luminances are much higher than other luminances, the sub-pixels are arrayed in order of the highest-luminance color, the fourth-highest-luminance color, the fifth-highest-luminance color, the second-highest-luminance color, the third-highest-luminance color, the lowest-luminance color, or in order of the highest-luminance color, the third-highest-luminance color, the fifth-highest-luminance color, the second-highest-luminance color, the fourth-highest luminance color, the lowest-luminance color. According to such a sub-pixel array, the sub-pixel of a color with the highest luminance and the sub-pixel of a color with the second-highest luminance in an adjacent pixel are arrayed with a larger space therebetween in comparison to the array in which the sub-pixels are arrayed in order of the highest-luminance color, the fifth-highest-luminance color, the third-highest-luminance color, the fourth-highest-luminance color, the second-highest-luminance color, the lowest-luminance color, or in order of the highest-luminance color, the fourth-highest-luminance color, the second-highest-luminance color, the fifth-highest-luminance color, the third-highest luminance color, the lowest-luminance color. Therefore, excellent display qualities can be obtained.

It is preferable that the display device includes a signal line (dummy signal line) on the non-display region side of the sub-pixel positioned at the at least one terminal (the terminal sub-pixel). This signal line may or may not be connected to the signal line arranged to drive sub-pixels. The configuration in which the dummy signal line is connected to the signal line arranged to drive sub-pixels means that a signal voltage is not applied directly from a driver (driving circuit) to the dummy signal line and the dummy signal line is connected to a signal line for another sub-pixel. In this case, to the dummy signal line branched from a signal line arranged to drive a sub-pixel, a signal voltage which is sent from a driver to the signal line arranged to drive the sub-pixel is sent and applied.

A signal line arranged to drive the terminal sub-pixel is disposed at one end (on the display region center side) of the above-mentioned terminal sub-pixel, but the terminal sub-pixel is not positioned between such a signal line arranged to drive the terminal sub-pixel and a signal line arranged to drive an adjacent sub-pixel, unlike sub-pixels other than the terminal sub-pixel. However, if the above-mentioned dummy signal is disposed on the non-display region side of the terminal sub-pixel, as in this configuration, change in electric potential, attributed to a parasitic capacitance generated between the terminal sub-pixel electrode (display electrode) and the signal line arranged to drive the terminal sub-pixel can be closer to change in electric potential in the sub-pixels other than the terminal sub-pixel. For example, as long as the terminal sub-pixel is positioned between the signal line arranged to drive the terminal sub-pixel and the dummy signal line connected to the signal line arranged to drive a sub-pixel adjacent to the terminal sub-pixel, the change in electric potential attributed to the parasitic capacitance generated between the terminal sub-pixel electrode (display electrode) and the signal line arranged to drive the terminal sub-pixel can be almost the same as that in other sub-pixels other than the terminal sub-pixel, even if the sub-pixels are driven by the inversion driving in which signal voltages having inverse polarities are applied to mutually adjacent signal lines arranged to drive sub-pixels or by applying signal voltages with the same polarity to mutually adjacent signal lines arranged to drive sub-pixels. As a result, the uneven line in display images, attributed to the terminal sub-pixel, can be prevented, and therefore excellent display images can be obtained.

It is preferable that the display device includes a sub-pixel not involved in display on the non-display region side of the sub-pixel positioned at the at least one terminal (the terminal sub-pixel). The "sub-pixel not involved in display" means a sub-pixel which is disposed in the non-display region and driven through the above-mentioned dummy signal line. The dummy signal line is disposed to eliminate the parasitic capacitance generated between the terminal sub-pixel electrode (display electrode) and the signal line arranged to drive the terminal sub-pixel, as mentioned above. According to this configuration in which the sub-pixel not involved in display is included, the uneven line in display images, attributed to the terminal sub-pixel, can be prevented, and simultaneously influx of impurities into the display region, electrostatic discharge damage, and the like, can be prevented.

It is preferable that the sub-pixels in the pixel are arrayed in accordance with a stripe array. The stripe array is generally known to be suitable for displaying lines, figures, and characters. However, one terminal sub-pixel is in one pixel according to the stripe array. Therefore, the uneven line may be easily observed visually in comparison to other arrays, depending on the sub-pixel disposed as the terminal sub-pixel. For this problem, according to various preferred embodiments of the present invention, even if the sub-pixels in the pixel are arrayed in accordance with a stripe array, generation of the uneven line is prevented and excellent display qualities can be provided in display device such as a display for personal computers for which high-definition display is needed.

It is preferable that the display device is a liquid crystal display device and includes color filters. The color filter is generally formed of a resin film including a dye or a pigment of red, blue, and the like. The display device according to various preferred embodiments of the present invention can be preferably used in a display for personal computers, a liquid crystal TV, and the like and provide excellent display qualities.

It is preferable that the color filters have substantially the same film thickness and are disposed in the sub-pixels, respectively. If the color filters do not have substantially the same film thickness, it becomes difficult to uniform the thickness of the liquid crystal layer and the following problems may be generated: (1) a response speed differs among the sub-pixels; (2) a view angle in oblique directions becomes smaller; and (3) a liquid crystal capacity is different among the sub-pixels, and thereby flicker in screen, or deterioration of liquid crystals, caused by burn-in, may be generated, for example. However, if the color filters having substantially the same film thickness are disposed in the sub-pixels, respectively, as in the present configuration, the above-mentioned problems can be solved and simultaneously the liquid crystal display device in which the uneven line in display images is prevented can be provided.

According to preferred embodiments of the display device of the present invention, linear unevenness (uneven line) generated in one direction of a display image can be prevented and excellent display qualities can be obtained.

Other features, elements, processes, steps, characteristics and advantages of the present invention will become more apparent from the following detailed description of preferred embodiments of the present invention with reference to the attached drawings.

BRIEF DESCRIPTION OF DRAWINGS

FIGS. 4A-4F show a production method of a color filter substrate in the display device according to a preferred embodiment of the present invention.

FIGS. 6A and 6B schematically show sub-pixel arrays according to a preferred embodiment of the present invention in pixels including sub-pixels of non-specified four colors, wherein FIG. 6A shows an array in which a sub-pixel having a color with the lowest luminance is disposed as the terminal sub-pixel; and FIG. 6B shows an array in which a sub-pixel having a color with the third-highest luminance is disposed as the terminal sub-pixel.

FIGS. 7A-7C schematically show sub-pixel arrays according to a preferred embodiment of the present invention in pixels including sub-pixels of non-specified five colors, wherein FIG. 7A shows an array in which a sub-pixel having a color with the lowest luminance is disposed as the terminal sub-pixel; FIG. 7B shows an array in which a sub-pixel having a color with the fourth-highest luminance is disposed as the terminal sub-pixel; and FIG. 7C shows an array in which a sub-pixel having a color with the third-highest luminance is disposed as the terminal sub-pixel.

FIGS. 8A-8D schematically show sub-pixel arrays according to a preferred embodiment of the present invention in pixels including sub-pixels of non-specified six colors, FIG. 8A shows an array in which a sub-pixel having a color with the lowest luminance is disposed as the terminal sub-pixel; FIG. 8B shows an array in which a sub-pixel having a color with the fifth-highest luminance is disposed as the terminal sub-pixel; FIG. 8C shows an array in which a sub-pixel having a color with the fourth-highest luminance is disposed as the terminal sub-pixel; and FIG. 8D shows an array in which a sub-pixel with the third-highest luminance is disposed as the terminal sub-pixel.

DETAILED DESCRIPTION OF PREFERRED EMBODIMENTS

The present invention is described in more detail below with reference to preferred embodiments using drawings, but it is not limited to only these preferred embodiments.

Preferred Embodiment 1

Figure 1:
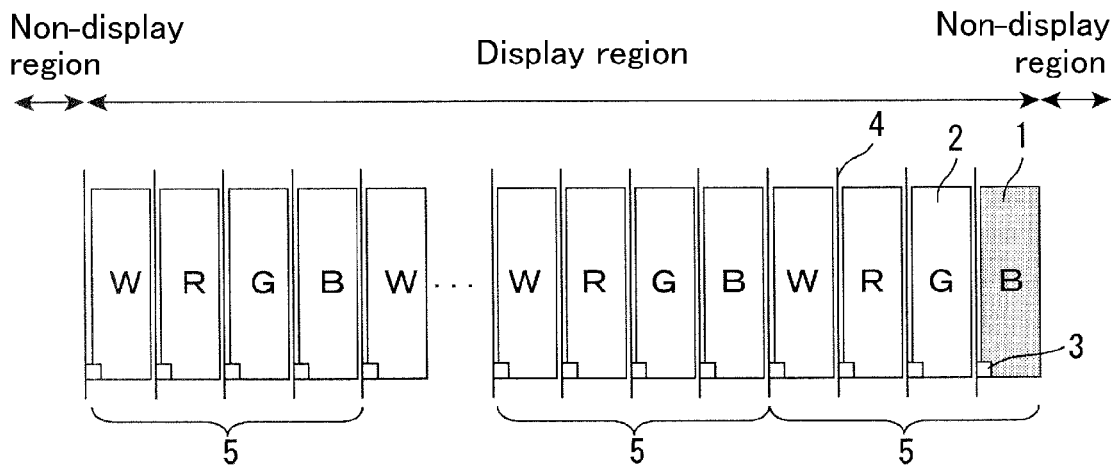
FIG. 1 is a planar view schematically showing one example of the configuration of the pixels in the display device according to a preferred embodiment of the present invention.

FIG. 1 is a planar view schematically showing one example of a configuration of pixels in the display device according to a preferred embodiment of the present invention.

As shown in FIG. 1, pixels 5 constituting a display region in the display device of the present preferred embodiment each include sub-pixels 2 of four colors (W, R, G, and B). At the left end of each sub-pixel 2, a signal line arranged to drive sub-pixels 4 corresponding to the sub-pixel 2 is disposed. A TFT (Thin Film Transistor) 3 is connected to the signal line arranged to drive sub-pixels 4. In the present preferred embodiment, the signal line arranged to drive sub-pixels 4 is disposed on the display region center side of a sub-pixel 1 which is positioned at least one terminal of the display region (the terminal sub-pixel) and no signal line arranged to drive sub-pixel 4 is disposed on the non-display region side thereof. The "positioned at least one terminal" means that the sub-pixel 1 is positioned at least at one of the both terminals in the lateral direction if the direction where the signal lines arranged to drive sub-pixels 4 are disposed is defined as the vertical direction of the display region.

In the present preferred embodiment, a liquid crystal display device is preferably prepared as the display device.

A method of preparing a TFT array substrate is first mentioned. A gate electrode and a gate wiring, made of aluminum and the like, are formed on a glass substrate. Thereon, a gate insulating film made of $SiO_2$ and the like is formed by a CVD method and the like. Then, amorphous silicon and SiNx which forms an etching protective film are successively formed on the gate insulating film by a plasma CVD method and the like, thereby forming an etching protective film by patterning. Then, an island-shaped $n^+$ amorphous silicon film is formed. Then, a display electrode (sub-pixel electrode) made of ITO (Indium Tin Oxide), a drain electrode, a source electrode, and a source wiring (signal line arranged to drive sub-pixels) are formed.

Figure 2:
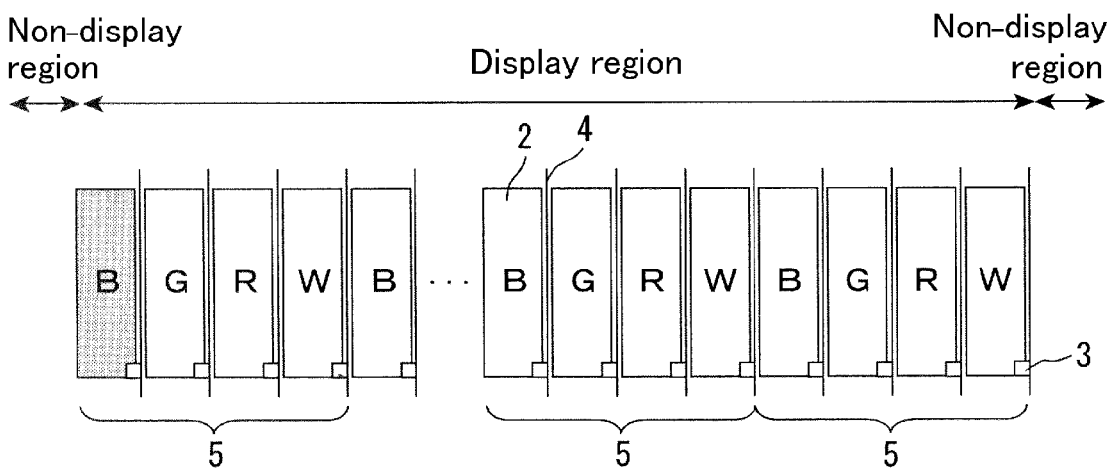
FIG. 2 is a planar view schematically showing another example of the configuration of the pixels in the display device according to a preferred embodiment of the present invention.
Figure 3:
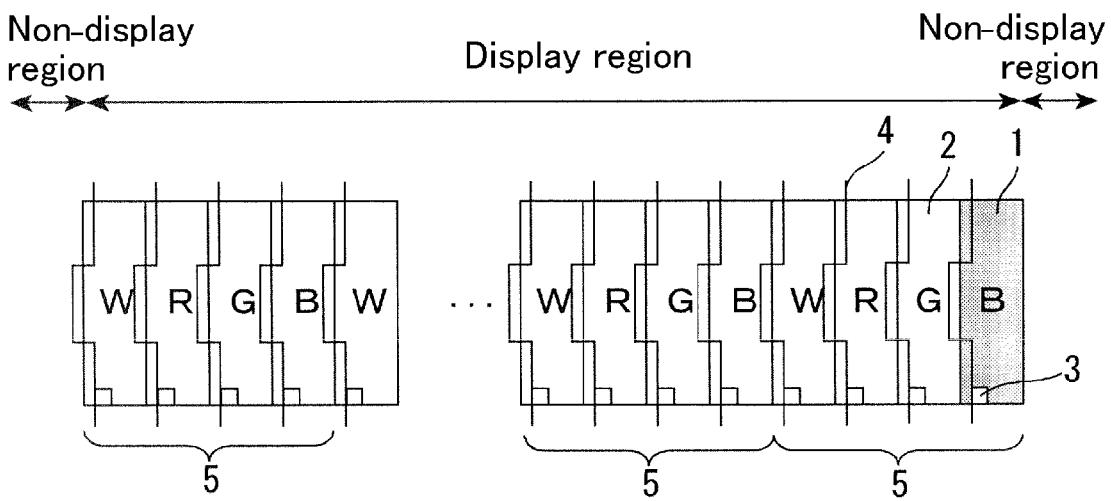
FIG. 3 is a planar view schematically showing another example of the configuration of the pixels in the display device according to a preferred embodiment of the present invention.

According to the present preferred embodiment, the signal line arranged to drive sub-pixels 4 is disposed at the left end of the sub-pixel 2 when attached to a color filter substrate, as shown in FIG. 1. However, the position where the signal line 4 is formed is not especially limited and the signal line 4 may be disposed at the right end of the sub-pixel 2, as shown in FIG. 2. In this case, the terminal sub-pixel is positioned at the left terminal of the display region. The shape of the signal line arranged to drive sub-pixels 4 is not especially limited and may be a straight-line shape as in the present preferred embodiment. As shown in FIG. 3, the signal line arranged to drive sub-pixels 4 may have a zigzag shape to partly overlap with an adjacent sub-pixel 2. In this case, it is preferable that the portion where the signal line 4 overlaps with the adjacent sub-pixel is positioned within a region having a length that is one third of the lateral length of the sub-pixel from the end on the display region center side. In addition, the TFT 3 is disposed at the lower left of the sub-pixel in FIG. 3, but the position where the TFT 3 is formed is not limited thereto. A configuration in which the signal line arranged to drive sub-pixels is disposed at the right end of the sub-pixel and the TFT is disposed at the lower right of the sub-pixel, as shown in FIG. 2, may be used. If the signal line arranged to drive sub-pixels 4 has such a zigzag shape, the signal line arranged to drive an adjacent sub-pixel 2 is extended to the inside of the sub-pixel 2. Therefore, the parasitic capacitance generated between the sub-pixel electrode (display electrode) and a signal line arranged to drive an adjacent sub-pixel 4 is more easily influenced by the signal line arranged to drive the adjacent sub-pixel 4, in comparison to the case where the signal line arranged to drive sub-pixels 4 has a straight-line shape and does not overlap with the display electrode. Therefore, the effects of preferred embodiments of the present invention can be more exhibited. Finally, an alignment film is formed by spin coating and the like, and a TFT array substrate is prepared.

Then, a method of producing a color filter substrate is mentioned with reference to FIGS. 4A-4F. On a glass substrate 6 shown in FIG. 4A, a black matrix 7 is formed into a pattern by a shading material, as shown in FIG. 4B. Then, as shown in FIGS. 4C-4F, the colored layers (color filters) 11a to 11d are formed by a dry film method in a region where the black matrix is not formed such that a sub-pixel of blue with the lowest luminance among red, green, blue, and white is disposed as the terminal sub-pixel and that in the pixel, a sub-pixel of white with the highest luminance of the four colors is disposed at the other end. According to such an arrangement, the uneven line in display images, attributed to the terminal sub-pixel, can be prevented. The method of forming the colored layers is not especially limited. Examples thereof include an ink-jet method and a method of forming the colored layers by applying a liquid material into which a pigment and the like is dispersed on a substrate. If the colored layers are formed using a pigment, the type of components and a proportion of components in the pigment are not especially limited and may be flexibly determined in accordance with specific purposes. The film thickness of each colored layer is not especially limited, but it is preferable that the colored layers have the same film thickness. In this case, a response speed and a view angle of a liquid crystal display device can be improved, and flicker and deterioration of liquid crystals can be prevented. It is preferable that each colored layer has a thin film thickness if a color filter substrate in which a transmittance is prioritized is formed, and that it has a thick film thickness if a color filter substrate in which a color purity is prioritized is formed. If a white sub-pixel is formed, a transparent colored layer may be formed or a colored layer may not be formed. The step of forming the color filter substrate is not especially limited, and the black matrix may be formed after the colored layers are formed. The order of forming the colored layers is not especially limited.

Figure 5A:
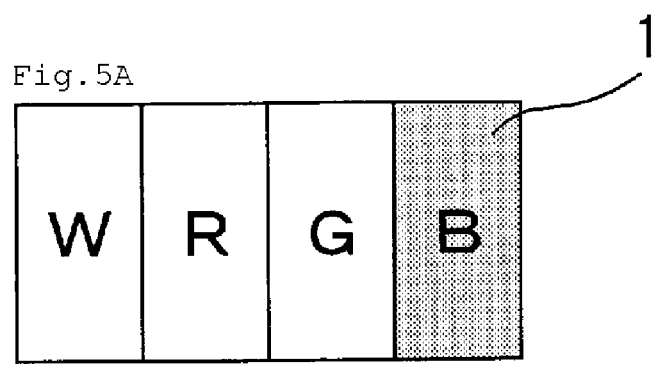
FIGS. 5A-5D schematically show sub-pixel arrays according to a preferred embodiment of the present invention in pixels including sub-pixels of four colors of red (R), blue (B), green (G), and white (W).
Figure 5B:
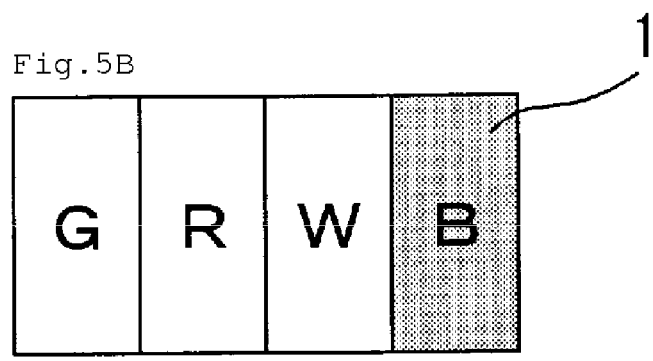
Figure 5C:
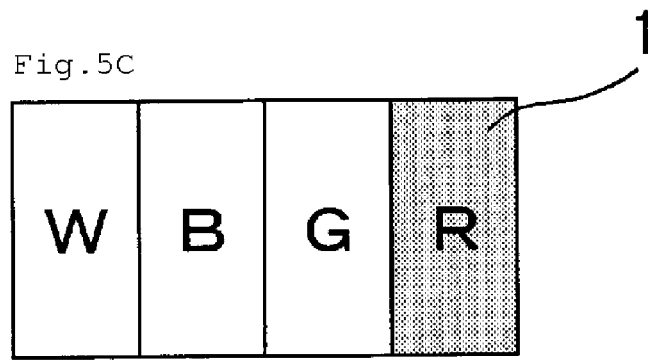
Figure 5D:
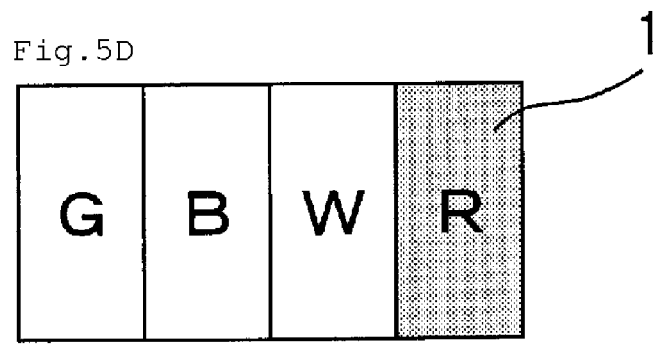

As long as the terminal sub-pixel is not a sub-pixel with the highest brightness, the sub-pixel array is not especially limited to that shown in FIGS. 4A-4F and may be an array shown in FIG. 5B if the terminal sub-pixel is a blue sub-pixel, as in the present preferred embodiment (an array shown in FIG. 5A is the same as in FIGS. 4A-4F). If the pixel is constituted by sub-pixels of four colors of red, green, blue, and white as in the present preferred embodiment, the sub-pixels are white, green, red, and blue in descending order of luminance. Therefore, sub-pixel arrays shown in FIGS. 5C and 5D where a red sub-pixel that is a sub-pixel other than a white sub-pixel with the highest luminance is disposed as the terminal sub-pixel 1 may be used. Further, an array in which a green sub-pixel is disposed as the terminal sub-pixel 1 may be used.

Figure 6A:
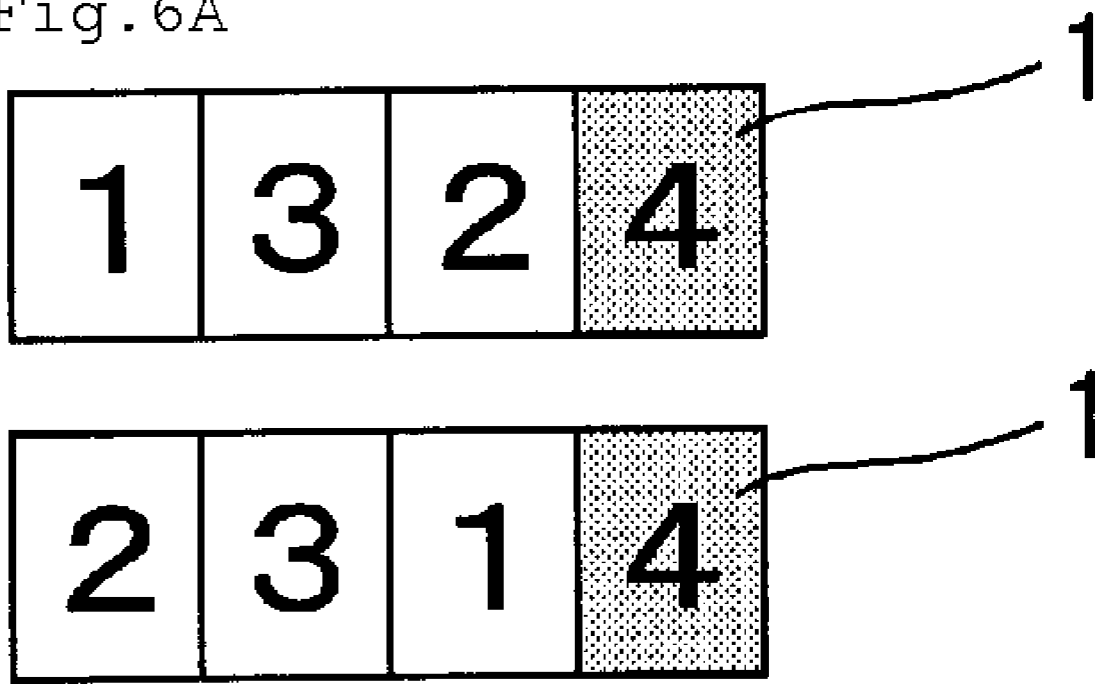
Figure 6B:
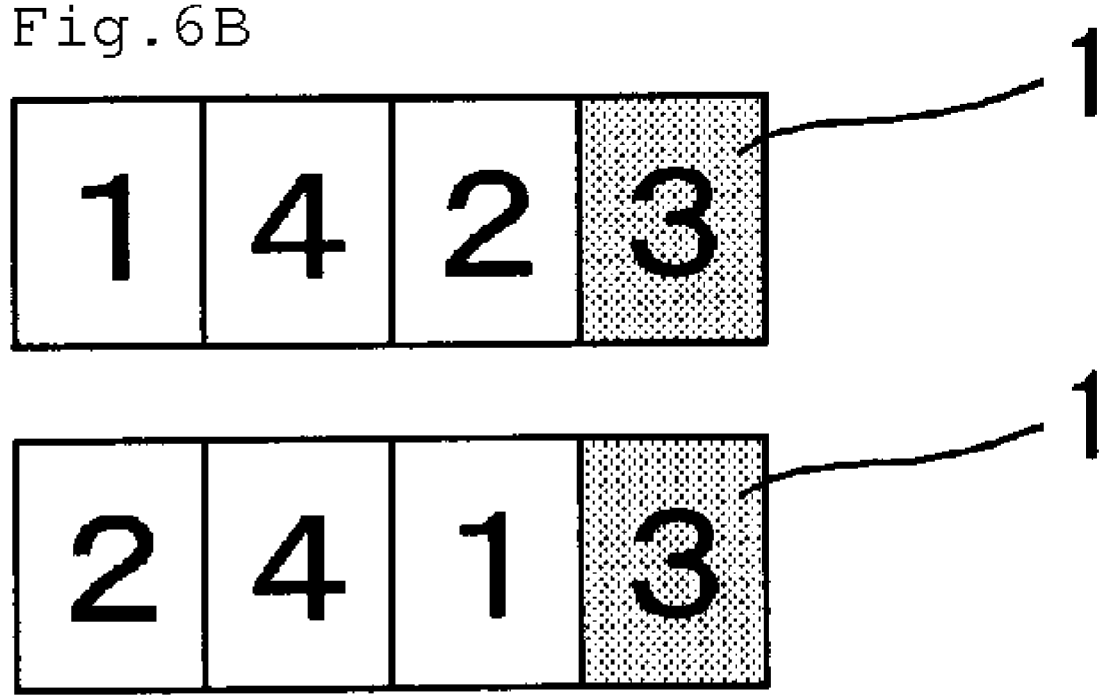

If sub-pixels of four colors constitute the pixel, the four colors are not limited to red, green, blue, white as in the present preferred embodiment. Examples of the four-color combination include a combination of red, green, blue, and yellow, a combination of red, green, blue, and magenta, and a combination of red, green, blue, and cyan. In this case, as shown in FIGS. 6A and 6B, the uneven line generated in display images, attributed to the terminal sub-pixel 1, can be prevented as long as the pixel has a sub-pixel array in which the terminal sub-pixel 1 is a sub-pixel other than a sub-pixel with the highest luminance in each combination. Particularly in the configuration shown in FIG. 6A in which a sub-pixel having a color with the lowest luminance of four colors is disposed as the terminal sub-pixel 1, generation of the uneven line, attributed to the terminal sub-pixel 1, can be effectively prevented. If the pixel is constituted by sub-pixels of four colors, the pixel has a sub-pixel array in which a sub-pixel having a color with the highest luminance of four colors is not adjacent to a sub-pixel having a color with the second-highest luminance. As a result, the uneven line generated when a line where the sub-pixels with higher luminances are adjacent to each other is displayed as an image can be prevented and thereby excellent display qualities can be obtained. If the sub-pixels of four colors constitute the pixel, the array which permits the most excellent display qualities is an array in which the sub-pixels are arrayed in order of the highest-luminance color, the third-highest-luminance color, the second-highest-luminance color, the lowest-luminance color. In this case, a sub-pixel having a color with the lowest luminance is positioned as the terminal sub-pixel 1. As mentioned above, the sub-pixel array in which the sub-pixel having a color with the lowest luminance or the sub-pixel having a color with the third-highest luminance is positioned as the terminal sub-pixel 1 among sub-pixel arrays in which the sub-pixels of four colors constitute the pixel is mentioned, but the sub-pixel array is not limited thereto. A sub-pixel array in which the sub-pixel having a color with the second-highest luminance is positioned as the terminal sub-pixel 1 may be used.

The pixel may be constituted by sub-pixels of five colors, for example. The five colors are not especially limited, and examples of the five-color combination include a combination of red, green, blue, white, and magenta, a combination of red, green, blue, yellow, and cyan, and a combination of red, green, blue, magenta, and cyan. Also in this case, the pixel has a sub-pixel array in which a sub-pixel other than a sub-pixel having a color with the highest luminance in each combination is disposed as the terminal sub-pixel 1 and the sub-pixel having a color with the highest luminance of five colors is not adjacent to a sub-pixel having a color with the second-highest luminance, as in the case where the pixel is constituted by the sub-pixels of four colors. FIGS. 7A-7C show sub-pixel arrays in which sub-pixels having colors with the lowest luminance, the fourth-highest luminance, and the third-highest luminance are disposed as the terminal sub-pixels 1, respectively. The sub-pixel array in which the pixel is constituted by sub-pixels of five colors is not limited thereto, and may be a sub-pixel array in which a sub-pixel having a color with the second-highest luminance is disposed as the terminal sub-pixel. If the pixel is constituted by sub-pixels of five colors, the array which permits the most excellent display qualities is an array in which the sub-pixels are arrayed in order of the fourth-highest-luminance color, the second-highest-luminance color, the third-highest-luminance color, the highest-luminance color, the lowest-luminance color, or in order of the third-highest-luminance color, the second-highest-luminance color, the fourth-highest-luminance color, the highest-luminance color, the lowest-luminance color. In this case, a sub-pixel having a color with the lowest luminance is disposed as the terminal sub-pixel 1.

The pixel may be constituted by sub-pixels of six colors. The six colors are not especially limited, and examples of the six-color combination include a combination of red, green, blue, white, yellow, cyan, and magenta. Also in this case, the pixel has a sub-pixel array in which a sub-pixel other than a sub-pixel having a color with the highest luminance in each combination is disposed as the terminal sub-pixel 1 and the sub-pixel having a color with the highest luminance of six colors is not adjacent to a sub-pixel having a color with the second-highest luminance, as in the case where the pixel is constituted by the sub-pixels of four colors. FIGS. 8A-8D show sub-pixel arrays in which sub-pixels having colors with the lowest luminance, the fifth-highest luminance, the fourth-highest luminance, and the third-highest luminance are disposed as the terminal sub-pixels 1, respectively. The sub-pixel array in which the pixel is constituted by sub-pixels of six colors is not limited thereto, and may be a sub-pixel array in which a sub-pixel having a color with the second-highest luminance is disposed as the terminal sub-pixel 1. If the pixel is constituted by sub-pixels of six colors, the array which permits the most excellent display qualities is an array in which the sub-pixels are arrayed in order of the lowest-luminance color, the second-highest-luminance color, the fourth-highest-luminance color, the third-highest-luminance color, the fifth-highest-luminance color, the highest-luminance-color, in order of the highest-luminance color, the fourth-highest-luminance color, the fifth-highest-luminance color, the second-highest-luminance color, the third-highest-luminance color, the lowest-luminance color, or in order of the highest-luminance color, the third-highest-luminance color, the fifth-highest-luminance color, the second-highest-luminance color, the fourth-highest-luminance color, the lowest-luminance color. In this case, a sub-pixel having a color with the lowest luminance is disposed as the terminal sub-pixel 1.

Then, a common electrode made of ITO is formed on the colored layers by a sputtering method, and thereon an alignment film is formed by a sputtering method. Then, over the alignment film in the TFT array substrate, plastic beads are spread as a spacer. The kind of the spacer is not especially limited. If columnar spacers are used, such spacers are directly disposed on the substrate. Finally, the color filter substrate and the TFT array substrate are attached to each other, and between the both substrates, liquid materials including liquid molecules are injected. As a result, a liquid crystal display device is prepared. The liquid crystal display device is prepared as a display device, but the display device is not limited to it and may be a self-luminous organic electroluminescent display device.

According to thus-prepared liquid crystal display device, the uneven line in display images, which is attributed to display defects of the terminal sub-pixel, generated due to the arrangement of the signal line arranged to drive sub-pixels, can be prevented. The uneven line in display images, attributed to the adjacent arrangement of sub-pixels with higher luminances, can be prevented also in sub-pixels other than the terminal sub-pixel. Therefore, excellent display qualities can be obtained.

This Non-provisional application claims priority under 35 U.S.C. §119 of Patent Application No. 2005-222064 filed in Japan on Jul. 29, 2005, the entire contents of which are hereby incorporated by reference.

The term "or more" used in the present application includes the value described. That is, the term "or more" includes the value described and values more than the value.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:
1. A display device comprising:
a plurality of pixels, each including an array of a plurality of sub-pixels of n-colors where n is an integer equal to at least 4; and
a plurality of signal lines arranged to drive the plurality of sub-pixels; wherein
the plurality of pixels and the plurality of signal lines are arranged in a display region of the display device;
one of the plurality of the signal lines arranged to drive a first one of the plurality of sub-pixels that is disposed at a first lateral end of the display region is arranged on a side of the first one of the plurality of sub-pixels, the side of the first one of the plurality of sub-pixels being positioned furthest from a non-display region of the display device;

none of the plurality of signal lines are arranged on another side of the first one of the plurality of sub-pixels that is positioned closest to the non-display region of the display device;

a color of the first one of the plurality of sub-pixels is a color with the lowest luminance of the n-colors;

the first one of the plurality of sub-pixels is disposed at a first lateral end of each of the plurality of pixels and a second one of the plurality of sub-pixels having a color with the highest luminance of the n-colors is disposed at a second lateral end of each of the plurality of pixels such that the remaining ones of the plurality of sub-pixels are provided between the first one of the plurality of sub-pixels and the second one of the plurality of sub-pixels; and the array of the plurality of sub-pixels in a first one of the plurality of pixels that is arranged at the first lateral end of the display region has same arrangement of sub-pixels as a second one of the plurality of pixels that is arranged at a second lateral end of the display region.

2. The display device according to claim 1, wherein the second one of the plurality of sub-pixels is not adjacent to a sub-pixel having a color with the second-highest luminance of the n-colors.

3. The display device according to claim 1, wherein each of the plurality of pixels includes sub-pixels of four colors, and the sub-pixels are arrayed in order of the highest-luminance color, the third-highest-luminance color, the second-highest-luminance color, the lowest-luminance color.

4. The display device according to claim 1, wherein each of the plurality of pixels includes sub-pixels of four colors and the sub-pixels are arrayed in order of white, red, green, blue.

5. The display device according to claim 1, wherein each of the plurality of pixels includes sub-pixels of five colors, and the sub-pixels are arrayed:

in order of the highest-luminance color, the fourth-highest-luminance color, the third-highest-luminance color, the second-highest-luminance color, the lowest-luminance color; or in order of the highest-luminance color, the third-highest-luminance color, the fourth-highest-luminance color, the second-highest-luminance color, the lowest-luminance color.

6. The display device according to claim 1, wherein each of the plurality of pixels includes sub-pixels of six colors, and the sub-pixels are arrayed:

in order of the highest-luminance color, the fifth-highest-luminance color, the third-highest-luminance color, the fourth-highest-luminance color, the second-highest-luminance color, the lowest-luminance color;

in order of the highest-luminance color, the fourth-highest-luminance color, the fifth-highest-luminance color, the second-highest-luminance color, the third-highest-luminance color, the lowest-luminance color;

in order of the highest-luminance color, the fourth-luminance color, the second-highest-luminance color, the fifth-highest-luminance color, the third-highest luminance color, the lowest-luminance color; or in order of the highest-luminance color, the third-highest-luminance color, the fifth-highest-luminance color, the second-highest-luminance color, the fourth-highest-luminance color, the lowest-luminance color.

7. The display device according to claim 1, wherein the display device includes a dummy signal line arranged on the another side of the first one of the plurality of sub-pixels of the first one of the plurality of pixels that is positioned closest to the non-display region.

8. The display device according to claim 7, wherein the display device includes a dummy sub-pixel in the non-display region; and the dummy sub-pixel is adjacent to the first one of the plurality of sub-pixels of the first one of the plurality of pixels that is disposed at the first lateral end of the display region.

9. The display device according to claim 1, wherein the plurality of sub-pixels in each of the plurality of pixels is arrayed in accordance with a stripe array.

10. The display device according to claim 1, wherein the display device is a liquid crystal display device and includes color filters.

11. The display device according to claim 10, wherein the color filters have substantially the same film thickness and are disposed in the plurality of sub-pixels, respectively.

12. The display device according to claim 1, wherein the n-colors include red, green, blue, and yellow.

13. The display device according to claim 12, wherein the second one of the plurality of sub-pixels is not adjacent to a sub-pixel having a color with the second-highest luminance of the n-colors.

14. The display device according to claim 12, wherein each of the plurality of pixels includes sub-pixels of four colors, and the sub-pixels are arrayed in order of the highest-luminance color, the third-highest-luminance color, the second-highest-luminance color, the lowest-luminance color.

15. The display device according to claim 12, wherein each of the plurality of pixels includes sub-pixels of four colors, and the sub-pixels are arrayed in order of yellow, red, green, blue.

16. The display device according to claim 12, wherein the display device includes a dummy signal line arranged on the another side of the first one of the plurality of sub-pixels of the first one of the plurality of pixels that is positioned closest to the non-display region.

17. The display device according to claim 16, wherein the display device includes a dummy sub-pixel in the non-display region; and the dummy sub-pixel is adjacent to the first one of the plurality of sub-pixels of the first one of the plurality of pixels that is disposed at the first lateral end of the display region.

18. The display device according to claim 12, wherein the plurality of sub-pixels in each of the plurality of pixels is arrayed in accordance with a stripe array.

19. The display device according to claim 12, wherein the display device is a liquid crystal display device and includes color filters.

20. The display device according to claim 19, wherein the color filters have substantially the same film thickness and are disposed in the plurality of sub-pixels, respectively.

* * * * *